United States Patent
Singh et al.

(10) Patent No.: US 9,633,842 B2
(45) Date of Patent: Apr. 25, 2017

(54) METAL INDUCED NANOCRYSTALLIZATION OF AMORPHOUS SEMICONDUCTOR QUANTUM DOTS

(71) Applicant: Okinawa Institute of Science and Technology School Corporation, Okinawa (JP)

(72) Inventors: Vidya Dhar Singh, Okinawa (JP); Cathal Cassidy, Okinawa (JP); Mukhles Ibrahim Sowwan, Okinawa (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 0 days.

(21) Appl. No.: 14/774,226

(22) PCT Filed: Mar. 7, 2014

(86) PCT No.: PCT/JP2014/001293
§ 371 (c)(1),
(2) Date: Sep. 10, 2015

(87) PCT Pub. No.: WO2014/141662
PCT Pub. Date: Sep. 18, 2014

(65) Prior Publication Data
US 2016/0042948 A1 Feb. 11, 2016

Related U.S. Application Data

(60) Provisional application No. 61/778,967, filed on Mar. 13, 2013.

(51) Int. Cl.
H01L 21/02 (2006.01)
C30B 1/02 (2006.01)
(Continued)

(52) U.S. Cl.
CPC ........ *H01L 21/02658* (2013.01); *C30B 1/023* (2013.01); *C30B 28/02* (2013.01);
(Continued)

(58) Field of Classification Search
CPC ......... H01L 21/02658; H01L 21/02532; H01L 21/02601; H01L 21/02631; H01L 29/04;
(Continued)

(56) References Cited

U.S. PATENT DOCUMENTS 5,275,851 A 1/1994 Fonash et al.
5,700,333 A 12/1997 Yamazaki et al.
(Continued)

FOREIGN PATENT DOCUMENTS

CN 101232941 A 7/2008
JP 2002-175983 A 6/2002
(Continued)

OTHER PUBLICATIONS

M.Durand-Charre, "Of swords and swordmaking", Microstructure of steels and cast iron, Springer, 2004, p. 28.
(Continued)

*Primary Examiner* — Scott B Geyer
(74) *Attorney, Agent, or Firm* — Chen Yoshimura LLP

(57) ABSTRACT

A method of forming crystallized semiconductor particles includes: forming amorphous semiconductor particles in a vacuumed aggregation chamber; transporting the amorphous semiconductor particles formed in the vacuumed aggregation chamber to a vacuumed deposition chamber within which a substrate is held; and applying a vapor of a metal catalyst to the amorphous semi-conductor particles while still in transit to the substrate in the vacuumed deposition chamber to induce crystallization of at least portion of the amorphous semiconductor particles via the metal catalyst in the transit, thereby depositing the crystal-
(Continued)

lized semiconductor particles with the metal catalyst attached thereto onto the substrate.

11 Claims, 11 Drawing Sheets

(51) Int. Cl.

| | |
|---|---|
| *C30B 28/02* | (2006.01) |
| *C30B 29/06* | (2006.01) |
| *C30B 29/60* | (2006.01) |
| *H01L 29/04* | (2006.01) |
| *H01L 29/16* | (2006.01) |
| *C01B 33/021* | (2006.01) |

(52) U.S. Cl.
CPC .............. *C30B 29/06* (2013.01); *C30B 29/60* (2013.01); *H01L 21/02532* (2013.01); *H01L 21/02601* (2013.01); *H01L 21/02631* (2013.01); *H01L 29/04* (2013.01); *H01L 29/16* (2013.01); *C01B 33/021* (2013.01)

(58) Field of Classification Search
CPC ......... H01L 29/16; C30B 1/023; C30B 28/02; C30B 29/06; C30B 29/60; C01B 33/021
See application file for complete search history.

(56) References Cited

U.S. PATENT DOCUMENTS

| | | | |
|---|---|---|---|
| 5,879,977 A | 3/1999 | Zhang et al. | |
| 6,100,562 A | 8/2000 | Yamazaki et al. | |
| 6,313,015 B1 | 11/2001 | Lee et al. | |
| 6,337,259 B1 | 1/2002 | Ueda et al. | |
| 6,420,246 B1 | 7/2002 | Yamazaki et al. | |
| 7,306,823 B2 | 12/2007 | Sager et al. | |
| 7,988,835 B2 | 8/2011 | Takahashi et al. | |
| 2006/0172555 A1 | 8/2006 | Gao et al. | |
| 2007/0158182 A1 | 7/2007 | Takahashi et al. | |
| 2008/0230763 A1 | 9/2008 | Zaidi et al. | |
| 2008/0230764 A1 | 9/2008 | Burt | |
| 2008/0254219 A1 | 10/2008 | Koh et al. | |
| 2010/0215915 A1 | 8/2010 | Norton et al. | |
| 2011/0203938 A1* | 8/2011 | Lu ....................... | C01B 33/021 205/410 |
| 2013/0142885 A1* | 6/2013 | Laurencin ............ | A61L 27/04 424/618 |

FOREIGN PATENT DOCUMENTS

| | | |
|---|---|---|
| JP | 2006-216658 A | 8/2006 |
| JP | 2007-525031 A | 8/2007 |
| JP | 2009-511754 A | 3/2009 |
| JP | 2010-80827 A | 4/2010 |
| JP | 2012-232869 A | 11/2012 |
| WO | 2007/049873 A1 | 5/2007 |
| WO | 2008/156892 A2 | 12/2008 |
| WO | 2012/095311 A1 | 7/2012 |

OTHER PUBLICATIONS

Duan et al., "Intracellular recordings of action potentials by an extracellular nanoscale field-effect transistor", Nature Nanotechnology, vol. 7, p. 174-179, (2012).
Green et al., "Efficient silicon light-emitting diodes", Nature, vol. 412, p. 805-808, (2001).
Atwater et al., "Plasmonics for improved photovoltaic devices", Nature Materials, vol. 9, p. 205-213, (2010).
Wang et al., "Broadband Light Absorption Enhancement in Thin-Film Silicon Solar Cells", Nano. Lett., 10, p. 2012-2018.
Wilcoxon et al., "Synthesis, structure and properties of metal nanoclusters", Chem. Soc. Rev. 35, p. 1162-1194.
Hwang et al., "Degenerate crystalline silicon films by aluminum-induced crystallization of boron-doped amorphous silicon", Appl. Phys. Lett., 101, p. 152108-1-152108-4, (2012).
Farmer et al., "Ceria Maintains Smaller Metal Catalyst Particles by Strong Metal-Support Bonding", Science, vol. 329, p. 933-936, (2010).
Shpyrko et al., "Surface Crystallization in a Liquid AuSi Alloy", Science, vol. 313, p. 77-80, (2006).
Kumagai et al., "Improving Crystallinity of Thin Si Film for Low-Energy-Loss Micro-/Nano-Electromechanical Systems Devices by Metal-Induced Lateral Crystallization Using Biomineralized Ni Nanoparticles", Jpn. J. Appl. Phys., 51, p. 11PA03-1-11PA03-5, (2012).
Itakura et al., "Microscopic studies of metal-induced lateral crystallization in SiGe", Appl. Phys. Lett., 96, p. 182101-1-182101-3, (2010).
Lin et al., "Crystallization of silicon films by new metal mediated mechanism", J Mater Sci: Mater Electron 21, p. 270-277, (2010).
Nast et al., "Influence of interface and Al structure on layer exchange during aluminum-induced crystallization of amorphous silicon", J. Appl. Phys., vol. 88, No. 2, p. 716-724, (2000).
Oleslnski et al., "The Ag—Si (Silver-Silicon) System", Bulletin of Alloy Phase Diagrams, vol. 10, No. 6, p. 635-640, (1989).
Nomoev et al., "Synthesis and Structure of Ag—Si Nanoparticles Obtained by the Electron••Beam Evaporation/Condensation Method", Tech. Phys. Lett., vol. 38, No. 4, p. 375-378, (2012).
Choi et al., "Intrinsic memory behavior of rough silicon nanowires and enhancement via facile Ag NPs decoration", J. Mater. Chem., 21, p. 13256-13261, (2011).
Bokhonov et al., "In-situ investigation of the formation of eutectic alloys in the systems silicon-silver and silicon-copper", Journal of Alloys and Compounds, 335, p. 149-156, (2002).
International Search Report (ISR) issued in PCT/JP2014/001293 mailed in May 2014.
Written Opinion (PCT/ISA/237) issued in PCT/JP2014/001293 mailed in May 2014.
Cassidy et al., "Inoculation of silicon nanoparticles with silver atoms" Scientific Reports, 2013.10.30, 3, 3083, pp. 1-7, DOI: 10.1038.
Lim, "Silicon Self-Assembled Nanodots Fabricated Using a Radio-Frequency Magnetron Sputtering Method", Universiti Teknologi Malaysia, Jan. 2008.
Wan et al., "Nanofilms of Si clusters confined in SiO nanoparticles prepared by low energy cluster beam deposition", Physics Letters A, Mar. 5, 2001, 280, pp. 357-360.
Sakrani et al., "Silicon Nanodots Grown on Sapphire Substrate by a Self Assembly Growth Method", Solid State Science and Technology, 2011, vol. 19, No. 2, pp. 184-192.
Zhao et al., "Nanocrystalline silicon quantum dots Thin Films Prepared by Magnetron Reaction Sputtering", Proc. of SPIE, Int. Symp. on Photoelectric Detection and Imaging, 2009, vol. 7381, pp. 738113-1-738113-10.
Sakrani et al., "The Growth Mechanism of Silicon Nanodots Synthesized by Sputtering Method", Int. Conf. on Enabling Science and Nanotechnology, 2011, pp. 109-113.
Khanna, "Plasma Synthesis of Quantum Dots", Nanoscience and Nanotechnology Letters, Mar. 2012, vol. 4, No. 3, pp. 275-290.
Sakrani et al., "Study of Silicon Quantum Dots Structure Growth using Radio Frequency Magnetron Sputtering", Int. Conf. on Enabling Science and Nanotechnology, Dec. 1-3, 2010.
Zhu et al., "Growth of high-density Si nanoparticles on Si3N4 and SiO2 thin films by hot-wire chemical vapor deposition", Journal of Applied Physics, Oct. 15, 2002, vol. 92, No. 8, pp. 4695-4698.
Thomas Gan et al., "Deposition of Nano-phase FeCo Thin Films using Plasma Focus Device", 31st EPS Conference on Plasma Physics, Jun. 28,- Jul. 2, 2004, vol. 28G P-1.032.
Urban III et al., "Nanophase films deposited from a high-rate, nanoparticle beam", J. Vac. Sci. Technol. B 20(3), May/Jun. 2002, p. 995-999.
Swihart, "Vapor-phase synthesis of nanoparticles", Current Opinion in Colloid and Interface Science, 2003, vol. 8, pp. 127-133.
Canadian Office Action dated Oct. 11, 2016, in a counterpart Canadian patent application No. 2,900,449.

(56) References Cited

OTHER PUBLICATIONS

Korean Office Action dated Oct. 7, 2016, in a counterpart Korean patent application No. 10-2015-7024266.
European Search Report dated Sep. 16, 2016, in a counterpart European patent application No. 14762623.8.
Chou et al., "Low-Temperature Metal Induced Crystallization of Amorphous Silicon Using Nano-Nickel Particles", Journal of Solid Mechanics and Materials Engineering, vol. 5, No. 1, Jan. 31, 2011, pp. 25-32.
Xu et al., "Silver-coated silicon nano-particles prepared by thermal decomposition", Journal of Materials Processing Technology, Elsevier, NL, Apr. 21, 2009, vol. 209, No. 8, pp. 4080-4083.
Chinese Office Action dated Dec. 6, 2016, in a counterpart Chinese patent application No. 201480013680.9.
Parola et al., "Structural properties of Ge nanocrystals synthesized by a PVD nanocluster source", Journal of Nanoparticle Research, Sep. 1, 2012, vol. 14.
Japanese Office Action dated Nov. 22, 2016, in a counterpart Japanese patent application No. 2015-542082.

* cited by examiner

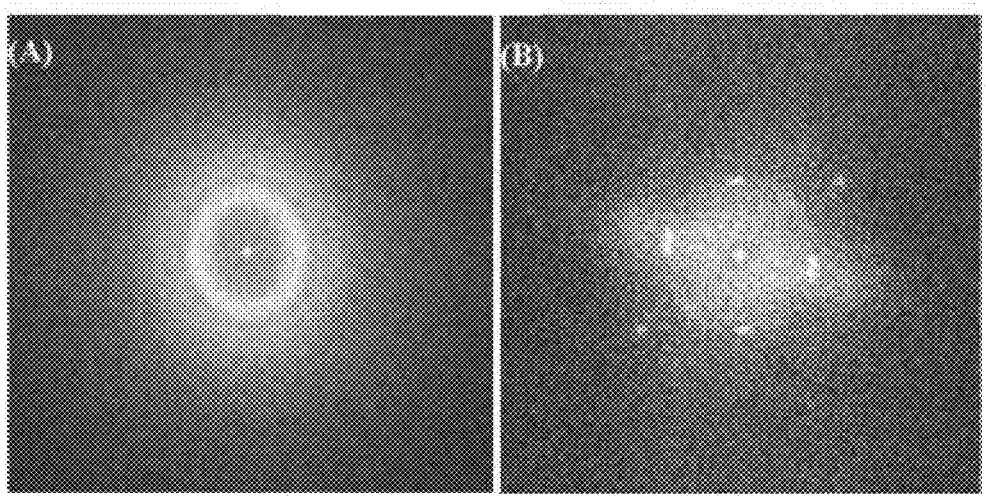
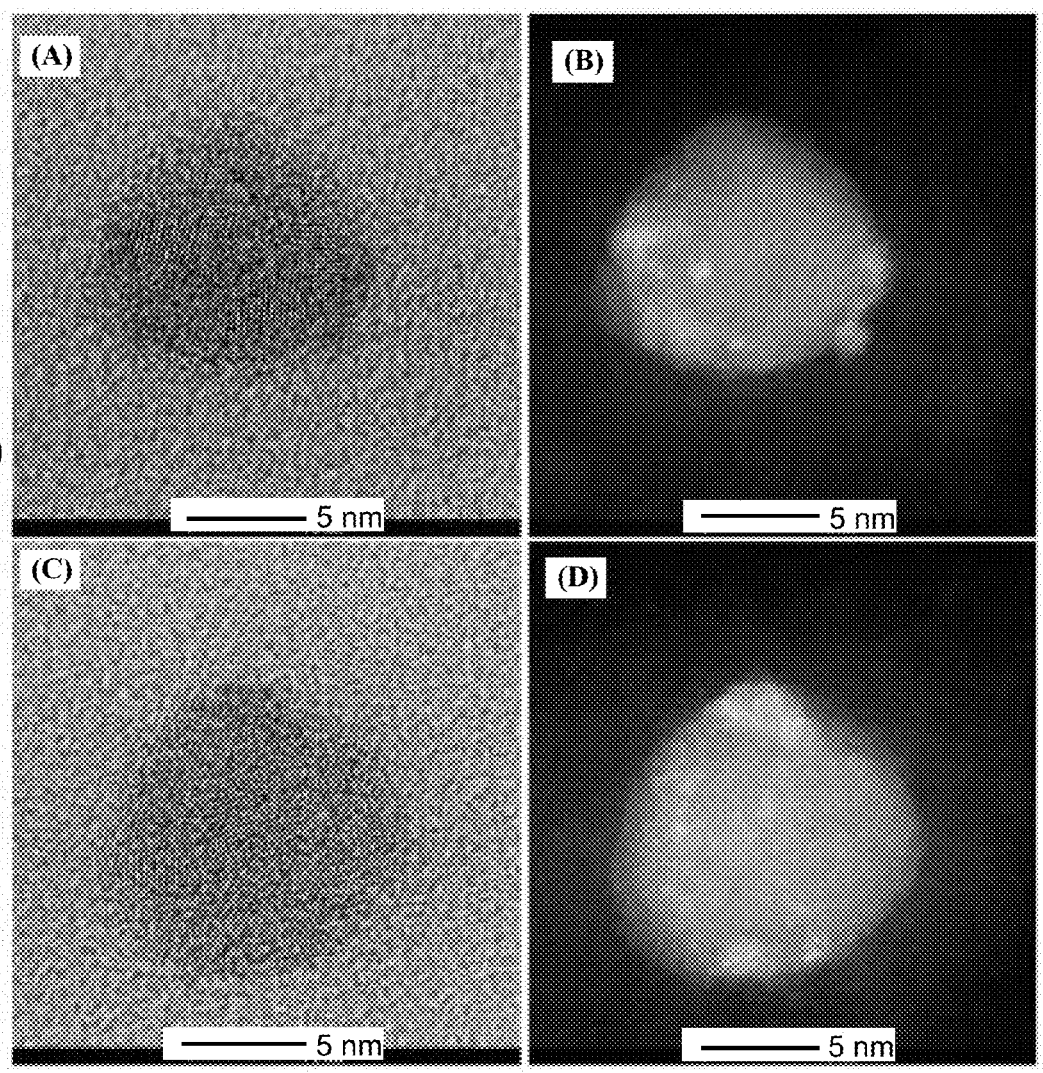

METAL INDUCED NANOCRYSTALLIZATION OF AMORPHOUS SEMICONDUCTOR QUANTUM DOTS

TECHNICAL FIELD

The present invention relates to metal induced crystallization of amorphous semi-conductor, and in particular, to metal induced crystallization of amorphous semi-conductor small dots and quantum dots.

BACKGROUND ART

Control of crystallinity and grain structure has been a central component of advanced materials engineering and metallurgy for centuries, ranging from forging of ancient Japanese katana or swords (Non-Patent Literature No. 1) to modern nano-engineered transistor gate electrodes (Non-patent Literature Nos. 2 and 3). Mechanical, optical, magnetic and electrical properties (to name a few) can all be tailored via control of parameters like grain size, grain boundary precipitates, and crystallographic defect densities and impurities (Non-patent Literature Nos. 4-6). Metal-induced crystallization (MIC) is a phenomenon in which amorphous semiconductor materials can be crystallized at relatively low temperatures in the presence of appropriate metal catalysts (Non-patent Literature Nos. 7-8). MIC has been reported for a wide range of bulk materials with quite different material interactions (e.g., Ni, Al and Ag) (Non-patent Literature Nos. 9-13). Metal induced crystallization (MIC) of amorphous semiconductor materials has been extensively studied due to its applications to solar cells and field effect transistors.

The Si—Ag system has been extensively studied over the last three decades (Non-patent Literature Nos. 14-17). Notably, with 11% Si content, this binary system has a eutectic temperature around 830 Celsius degrees –845 Celsius degrees (for reference, the melting points for bulk Si and Ag are 1414 Celsius degrees and 962 Celsius degrees, respectively) (Non-patent literature No. 15). Unlike many transition metal/Si systems, the mutual solubility of Ag and Si in the solid state are negligible (Non-patent Literature No. 16), which is an important attribute. A recent study by Bokhanov and Korchagin on the amorphous-Si film/Ag particle system concisely summarizes the mechanisms governing MIC; the formation of eutectics is preceded by metal diffusion into amorphous Si with the formation of metastable silver silicide. Subsequent cooling of the system leads to the decomposition of the metastable silicide and subsequently to the evolution of polycrystalline Si and metallic Ag (Non-patent Literature No. 17).

However, to date, these studies and development have been limited to three-dimensional bulk and two-dimensional thin films.

CITATION LIST

Non Patent Literature

NPL 1: M. Durand-Charre, "Microstructure of steels and cast iron" Springer p. 28 (2003).
NPL 2: X. Duan, R. Gao, P. Xie, T. Cohen-Karni, Q. Qing, H. S. Choe, B. Tian, X. Jiang, C. M. Lieber, Nature Nanotechnol.7, 174 (2012).
NPL 3: M. A. Green, J. Zhao, A. Wang, P. J. Reece, M. Gal, Nature 412, 805 (2001).
NPL 4: H. A. Atwater, A. Polman, Nature Mater. 9, 205 (2010).
NPL 5: W. Wang, S. Wu, K. Reinhardt, Y. Lu, S. Chen, Nano Lett. 10, 2012 (2010).
NPL 6: J. P. Wilcoxon, B. L. Abrams, Chem. Soc. Rev. 35, 1162 (2006).
NPL 7: J. D. Hwang, L. C. Luo, T. J. Hsueh, S. B. Hwang, Appl. Phys. Lett. 101, 152108 (2012).
NPL 8: J. A. Farmer, C. T. Campbell, Science 329, 933 (2010).
NPL 9: 0. G. Shpyrko et al., Science 313, 77 (2006).
NPL 10: S. Kumagai et al., Jpn. J. Appl. Phys. 51, 11PA03 (2012).
NPL 11: M. Itakura, S. Masumori, N. Kuwano, H. Kanno, T. Sadoh, M. Miyao, Appl. Phys. Lett. 96, 182101 (2010).
NPL 12: C. W. Lin, S. C. Lee, Y. S. Lee, J Mater Sci: Mater Electron 21, 270 (2010).
NPL 13: O. Nast, Andreas J. Hartmann, J. Appl. Phys. 88, 716 (2000).
NPL 14: R. W. Oleslnski, A. B. Gokhale, G. J. Abbaschlan, Bulletin of Alloy Phase Diagrams 635, 10 (1989).
NPL 15: A. V. Nomoev and S. P. Bardakhanov, Tech. Phys. Lett. 38, 375 (2012).
NPL 16: J. H. Choi et al., J. Mater. Chem. 21, 13256 (2011).
NPL 17: B. Bokhonov, M. Korchagin, Journal of Alloys and Compound 335, 149 (2002).

SUMMARY OF INVENTION

Technical Problem

There has been no report of metal induced crystallization of amorphous silicon nanoscale small particles or quantum dots, which would be useful for various bioimaging and biosensing applications, hydrogen storage and/or optoelectronics devices.

Accordingly, the present invention is directed to metal-induced crystallization of amorphous small-scale particles and quantum dots useful for various semiconductor engineering and fabrication.

An object of the present invention is to provide method for performing metal-induced crystallization of amorphous small-scale particles and quantum dots and to provide resulting metal-induced crystallized nanoscale particles or quantum dots useful for various semiconductor engineering and fabrication.

Solution to Problem

To achieve these and other advantages and in accordance with the purpose of the present invention, as embodied and broadly described, in one aspect, the present invention provides crystallinity control to the internal structure of semiconductor quantum dots (QDs) via in flight decoration and metal-induced crystallization (MIC), which, to the best of the inventor's knowledge, has not been achieved before.

In another aspect, the present invention provides a method of forming crystallized semiconductor particles, including: forming amorphous semiconductor particles in a vacuumed aggregation chamber; transporting the amorphous semiconductor particles formed in the vacuumed aggregation chamber to a vacuumed deposition chamber within which a substrate is held; and applying a vapor of a metal catalyst to the amorphous semiconductor particles while still in transit to the substrate in the vacuumed deposition chamber to induce crystallization of at least portion of the amorphous semiconductor particles via the metal catalyst in the transit, thereby depositing the crystallized semiconductor particles with the metal catalyst attached thereto onto the substrate.

In another aspect, the present invention provides a nanoscale poly-crystallized semi-conductor particle, comprising a metal-induced poly-crystallized semiconductor particle having a dimension in the order of nanometers.

Advantageous Effects of Invention

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

It is to be understood that both the foregoing general description and the following detailed description are exemplary and explanatory, and are intended to provide further explanation of the invention as claimed.

BRIEF DESCRIPTION OF DRAWINGS

FIG. 8 shows (A) a FFT pattern from the HR TEM images of amorphous Silicon nanoparticle and (B) a FFT pattern from the HR TEM images of crystalline Silicon nanoparticle.

FIG. 9 shows additional images of Si-core/Ag-subshell QDs after plasma clean process according to an embodiment of the present invention; (A) and (C) are bright-field images and (B) and (D) are HAADF-STEM images, respectively.

DESCRIPTION OF EMBODIMENTS

Figure 1A:
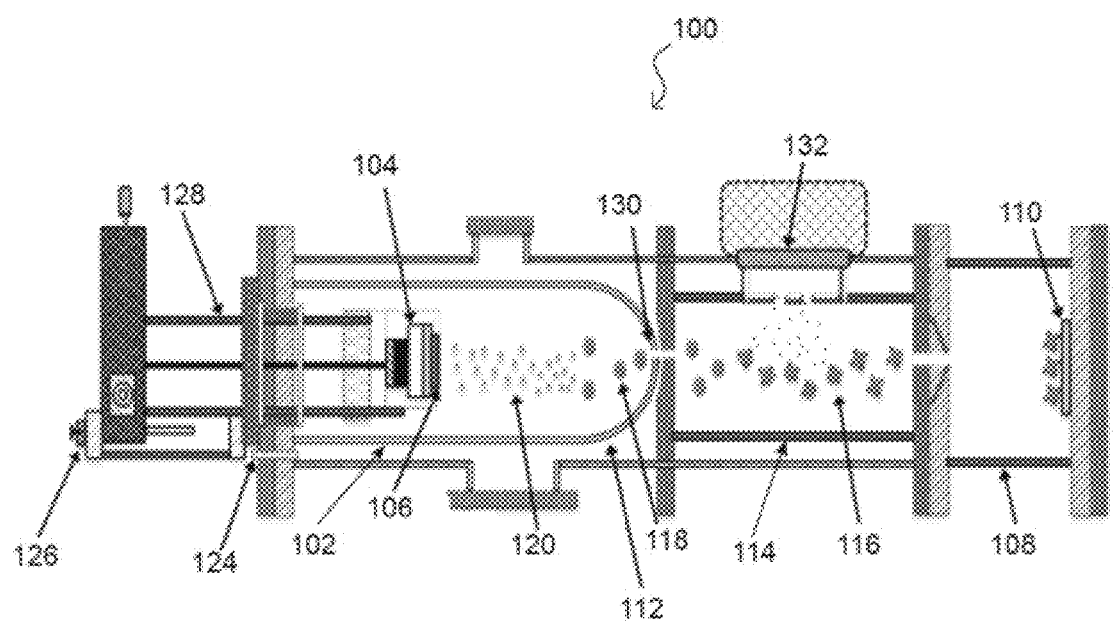
FIG. 1(A) is a schematic view of an advanced core-shell nanoparticle deposition system 100 used for the production of embodiments of the present invention.

In one aspect, the present invention provides controlled MIC in zero-dimensional nanostructures of amorphous silicon (Si) quantum dots for the first time, via application of silver (Ag) subshell nanoclusters to deliberately seed the crystallization process. The result is novel (nanophase Si-core)/(Ag-subshell) nanoparticles (Si core that is nanocrystalline /contains Si nanograins (crystallites)).

In some aspects of the present invention, the final number of grains in the Si quantum dot can be controlled and is proportional to the number of Ag nanoclusters forming the subshell. After deposition of the hybrid Si—Ag system, the Ag catalysts can be left in place, or removed via plasma etch to leave an undamaged Si core of the desired crystallinity. This approach, based on a modified magnetron sputter inert gas condensation technique, provides a general route for controlled MIC of semiconductor QDs (quantum dots), and the growth of multicomponent polycrystalline (semiconductor-core)/(metallic-subshell) nanoparticles.

These novel multicomponent nanoparticles have quite apparent applications in various technical fields, such as:

(i) Multimodal bioimaging and biosensors (because silicon is photoluminescent while the silver is plasmonic material. Also, due to the unique structure of the hybrid particles, one can gain access to both the silicon core and the silver subshell);

(ii) Hydrogen storage (the Si core is a nanophase material suitable for absorbing more hydrogen at the grain boundaries, while the metal can work as a catalyst to speed the process of absorption and desorption of hydrogen at relatively lower temperatures); and (iii) Optoelectronic devices like infrared detectors and photovoltaics owing to the unique optical properties of both core and subshell materials.

Furthermore, in some embodiments of the present invention, due to the small dimensions of the nanophase hybrid particles described herein, the volume of atoms in the disordered grain boundaries represents an atypically large fraction of the entire nanoparticle volume. Therefore, in comparison to conventional coarse-grained polycrystalline materials with the same composition and grain size above 50 nm, in some embodiments, nanoparticles of the present invention will have improved physical properties like increased thermal expansion, specific heat and strength; and reduced density, which further expands the range of applications of this material.

In one aspect, the present invention provides controlled MIC in a zero dimensional semiconductor (QD) system for the first time, using Si—Ag as an exemplary system. A customized gas-aggregated sputtering system is used, and Ag nanoclusters were applied as subshell seeds to induce crystallization, in-flight, of freshly-sputtered amorphous-Si QDs. This technology is applicable to other semiconductor/metal catalyst combinations, such as combinations of any one of Si, Ge, SiGe quantum dots with other metal Al, Au, Ni, Pd, Cu, etc. As described below, molecular dynamics (MD) simulation was conducted, which well illustrates the process of Ag atom interaction and nucleation on the Si QD cores.

In another aspect, the present invention uniquely demonstrates the dynamic and still tunable structure of freshly nucleated quantum dots whilst still en route from their nucleation chamber to their deposition substrate, and offers an exciting new dimension for controlling and engineering the crystallinity and functionality of zero dimensional semiconductor materials.

Overview of Equipment and Procedures

Various embodiments of the present invention are manufactured using a modified gas-aggregated sputtering system as illustrated in FIG. 1(A). FIG. 1(A) is a schematic view of an advanced core-shell nanoparticle deposition system 100 used for the production of embodiments of the present invention. The principles of particle formation in magnetron sputtering with inert gas condensation are well established (Non-patent literature Nos. 18 and 19). In some embodiments, a supersaturated Si vapor was generated by a sputtering target material 106 on the DC magnetron head 104 mounted in a water-cooled inert-gas aggregation chamber 102. Within this aggregation zone 112, nucleation of small liquid Si QDs (quantum dots) takes place in the (relatively high pressure) inert gas atmosphere, followed by the nucleation and growth of larger liquid Si QDs due to coalescence. The size distribution of the Si QDs can be controlled by adjusting experimental parameters, including the aggregation zone length, the aggregation chamber pressure and the magnetron power. The pressure difference between the (high pressure) aggregation zone 112 and the (low pressure) sample deposition chamber 108 transports the freshly-nucleated Si QDs through the differential-pumping aperture and out of the aggregation zone. Without further intervention, the QDs should stabilize and cool down to room temperature during transport. However, we applied an incident flux of low pressure Ag vapor to decorate the rapidly-cooling Si QDs with Ag aggregates, immediately upon exiting the aggregation zone 112. The Ag was sputtered from a linear magnetron target 132 in the coating zone 134 positioned parallel to the flight direction of the Si QD cores, en route from the aggregation zone 112 of the aggregation chamber 102 to the sample deposition chamber 108. More details are explained in respective sections below.

Evaluation of Embodiments

Figure 1B:
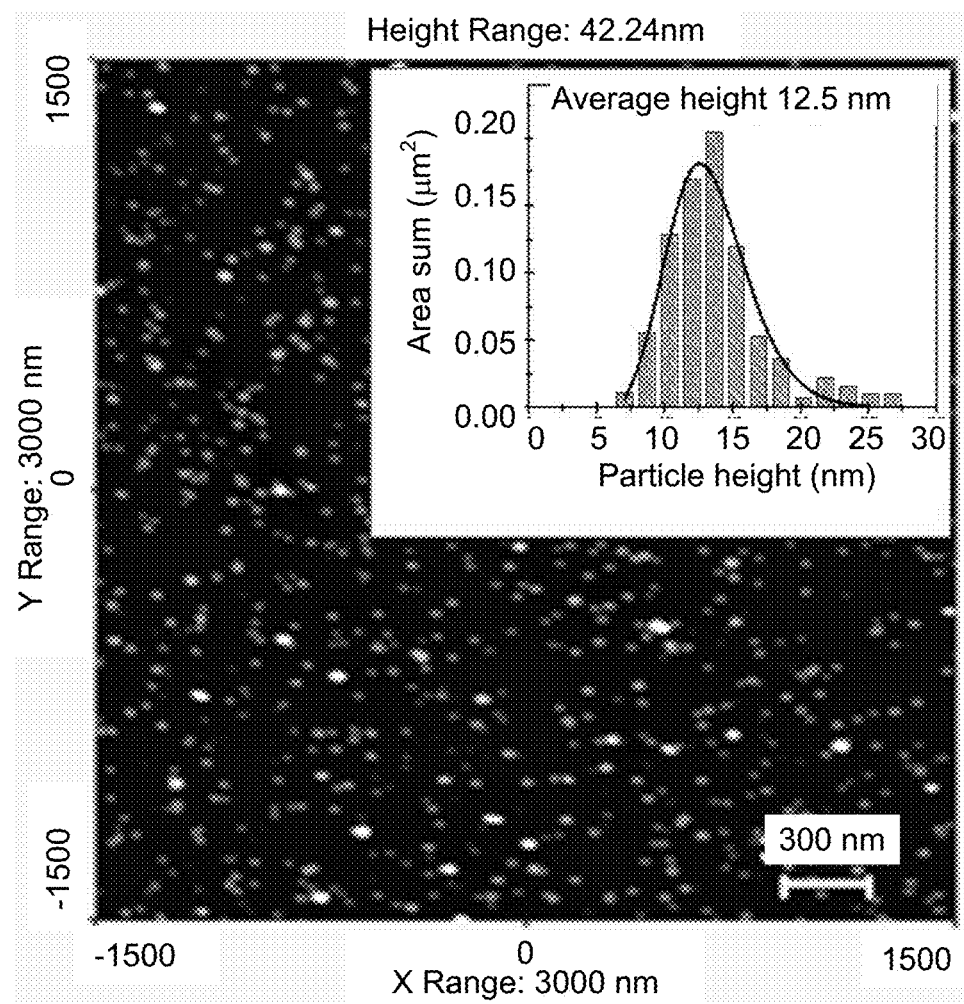
FIG. 1(B) is an AFM height image of Si—Ag nanoparticles with particle height distribution of more than 1000 particles (inset) according to an embodiment of the present invention. A log-normal distribution fit to the histogram is shown in the inset.

After substrate landing and load-lock transfer to an inert gas glovebox, atomic force microscopy (AFM) was used to study the size distribution and surface coverage of the deposited nanoparticles. A soft tapping mode AFM image and height distribution histogram of the hybrid nanoparticles is presented in FIG. 1(B) and in the inset, respectively. The height distribution can be approximated quite well with a log-normal function (curve in the inset), having an average height of 12.5 nm +−0.2 nm. The bright spots are aggregates of two or more nanoparticles, probably arising from the "piling up" or coalescence of two or more nanoparticles on the surface of the substrate. It is well-known that in AFM scans, height is a more reliable indicator of the true particle size than the lateral size; the latter being falsely inflated as a result of the convolution of the finite AFM tip size with the nanoparticle geometry. Further transmission electron microscopy (TEM), in various imaging modes, was applied to investigate the morphology and atomic structure of the deposited hybrid nanoparticles. Samples with various deposition conditions were investigated, and it is determined that simple undecorated Si QDs were amorphous, whilst Ag-decorated Si QDs were found to be polycrystalline (nanocrystalline also called nanophase). It is also found that there is a correlation between the number of Ag "surface seeds" and the complexity of the Si internal grain structure. The average diameter of the nanoparticles, estimated by the low-magnification TEM images (FIGS. 4(A)-4(D) to be discussed below), is consistent with the AFM results (FIG. 1(B)).

Figure 1C:
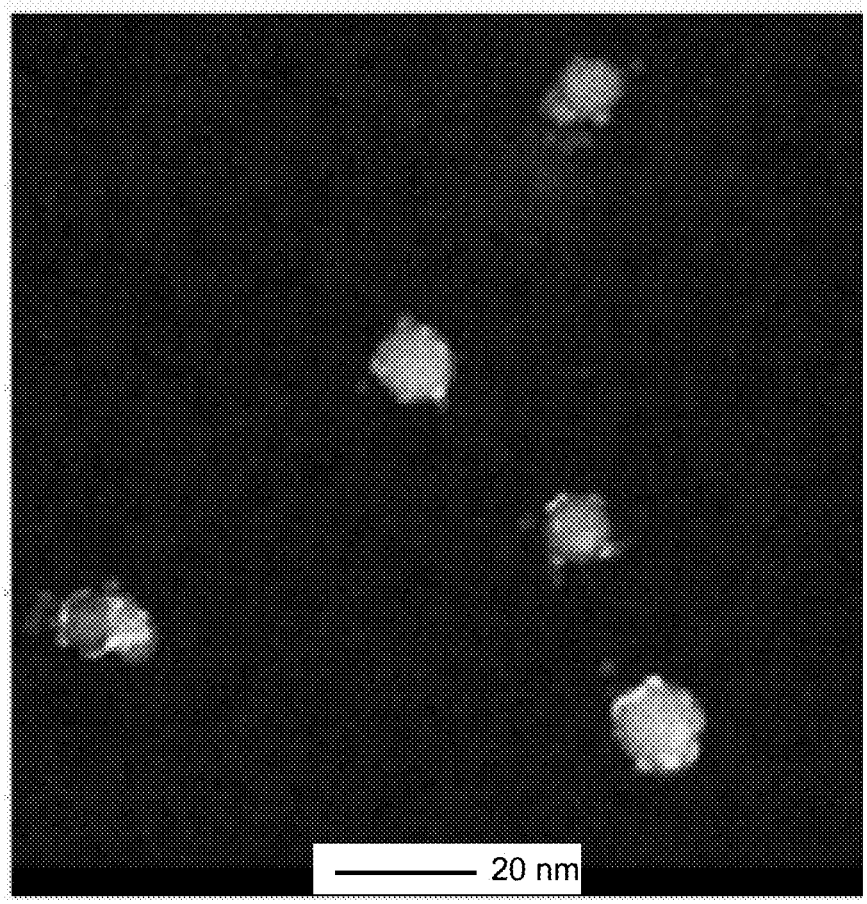
FIG. 1(C) is a low resolution HAADF-STEM micrograph of Si core-Ag subshell nanoparticles according to an embodiment of the present invention. The Si core appears in gray contrast decorated with several bright Ag nanoclusters.

FIG. 1(C) displays a low-magnification overview high angle annular dark field (HAADF) scanning TEM (STEM) micrograph of Ag-decorated Si QDs. The Si core appears gray, decorated with several bright Ag nanoclusters in line with the atomic number or Z-contrast expected from this imaging mode.

Figure 2:
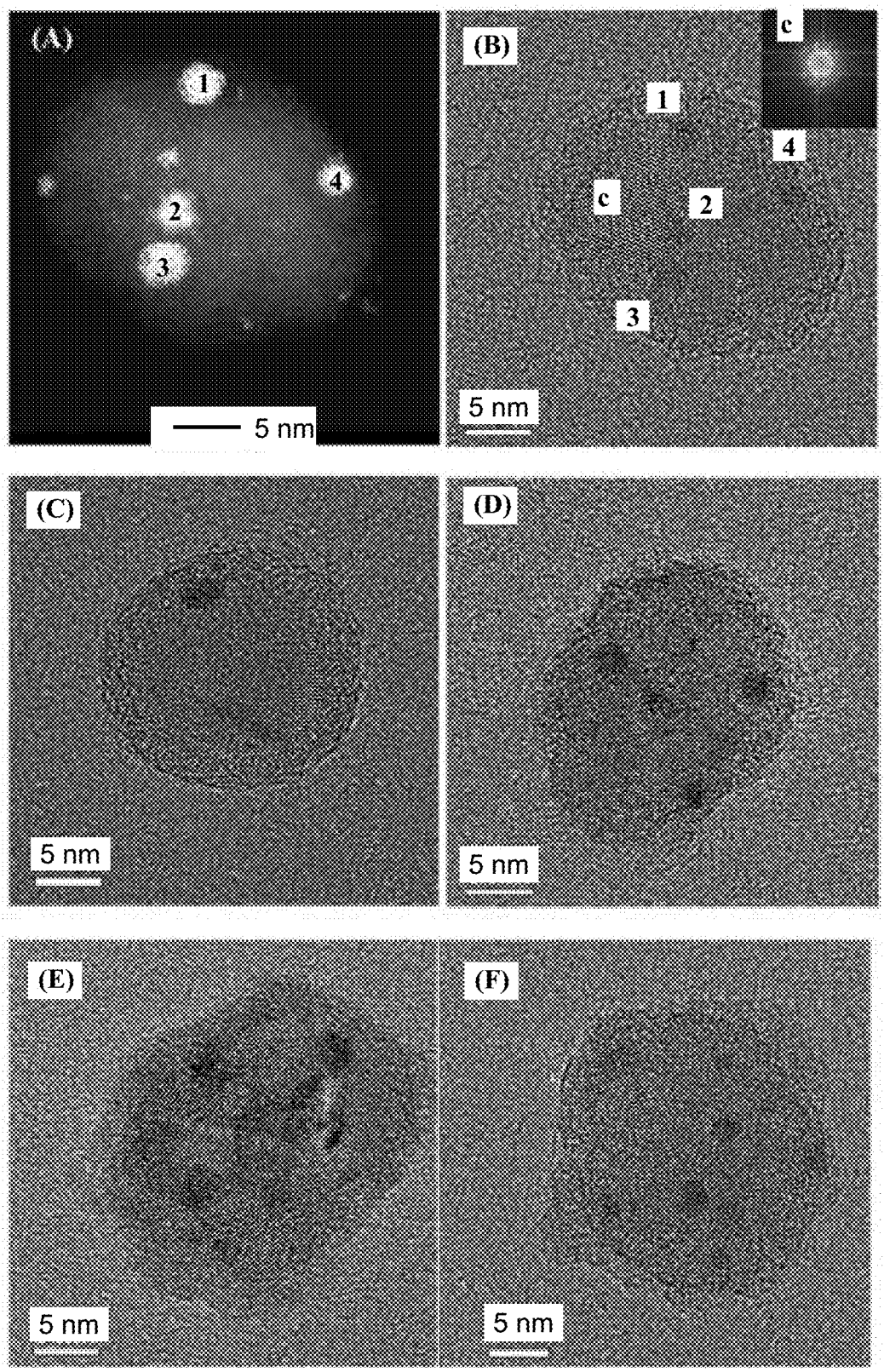
FIG. 2 shows: (A) a high resolution HAADF-STEM micrograph of Si core-Ag subshell nanoparticles according to an embodiment of the present invention (the Si core appears in gray contrast decorated with several bright Ag nanoclusters marked by numbers 1- 4 respectively; (B) a bright-field HRTEM image of the same nanoparticle as in (A) with the same orientation under the electron beam (the Ag nanoclusters previously numbered 1-4 in the HAADF mode appear like dark spots); (C) a bright-field HRTEM image of a nanoparticle having 2 Ag nanoclusters and 2 Si grains; (D) a bright-field HRTEM image of a nanoparticle having 3 Ag nanoclusters and 3 Si grains; (E) a bright-field HRTEM image of a nanoparticle having 6 Ag nanoclusters and 6 Si grains; and (F) a bright-field HRTEM image of a nanoparticle having 8 Ag nanoclusters and 9 Si grains. The bright-field HRTEM images (C)-(F) displays the correlation between the number of nanocrystalline Si grains and the number of Ag nanoclusters on the surface.

FIG. 2(A) shows a high resolution HAADF-STEM micrograph of one nanoparticle of irregular shape, with a size of about 13 nm encapsulated with an about 2 nm native oxide shell (samples were exposed to atmosphere before insertion in the TEM column). High-resolution TEM (HRTEM) image of the same nanoparticle, with unchanged orientation with respect to the electron beam, is shown in FIG. 2(B) (offering complementary contrast mechanisms). The Ag nanoclusters appear as dark spots, marked by numbers through 1-4. A TEM tilt series experiment of the same nanoparticle, as explained in detail with reference to FIG. 7 below confirmed that the Ag nanoclusters are on the surface and not embedded in the Si core. Both images of FIGS. 2(A) and 2(B) indicate that the Si core consists of small crystalline nanograins of different crystallographic orientations.

TEM lattice interference imaging of polycrystalline materials is fundamentally limited by the arbitrary number of grains in any given projection, and the arbitrary orientations of the crystal axes with respect to the electron beam, neither of which is known a priori. Great care must be taken to ensure that lattice interference patterns and associated Fourier transforms are not mis- or over-interpreted, for example as a result of misalignment, multiple-diffraction effects or Moire interference. In general, the number of grains will tend to be underestimated, as many grains will not be fortuitously aligned to a sufficiently low-index crystallographic axis with respect to the electron beam, and will therefore appear devoid of crystal structure. Nevertheless, in selected cases, fortuitous structure and alignment of certain regions may allow relatively simple interpretation.

Figure 5:
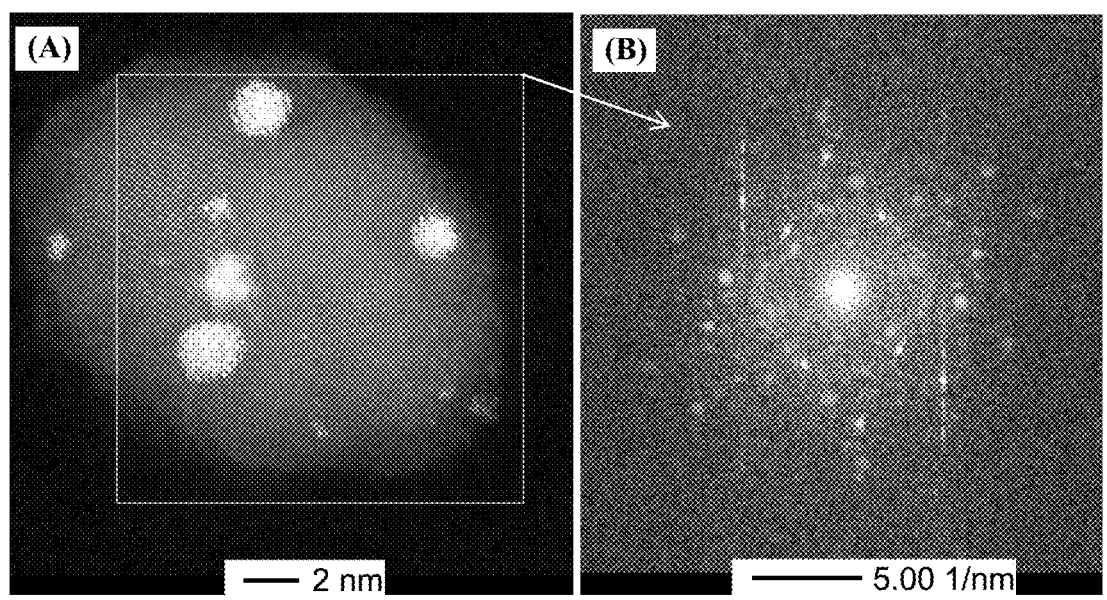
FIG. 5 is an HAADF-STEM image of a Si-core/Ag-subshell nanopartcile according to an embodiment of the present invention together with a FFT pattern.
Figure 6:
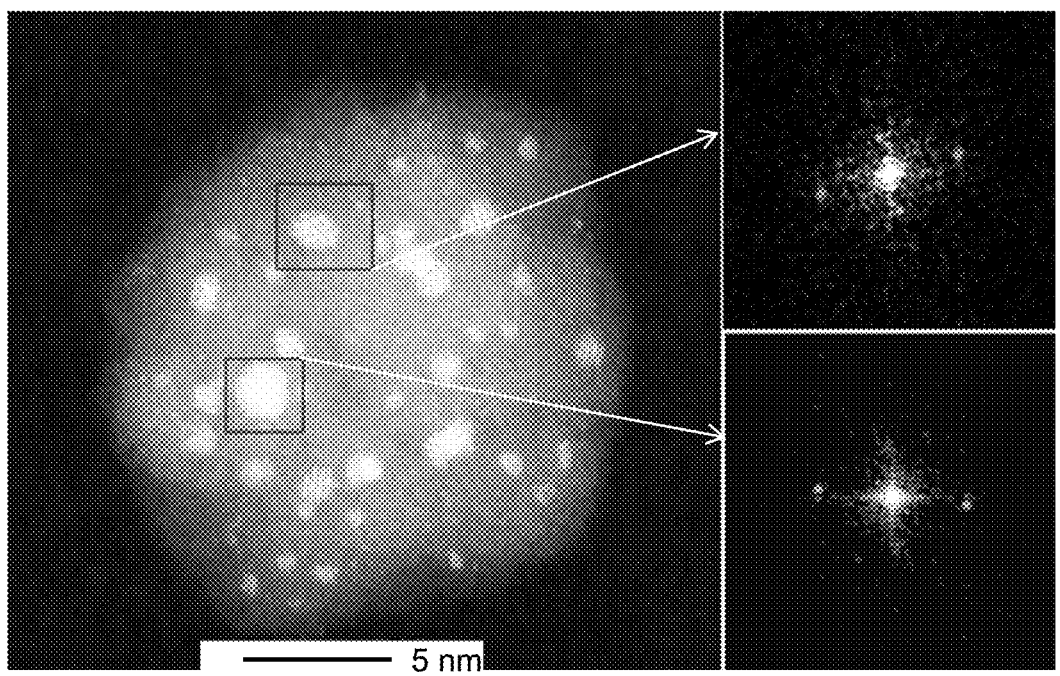
FIG. 6 is an HAADF-STEM image of selected Ag nanoclusters on a Si-core/Ag-subshell nanopartcile according to an embodiment of the present invention together with the corresponding FFT patterns.
Figure 7:
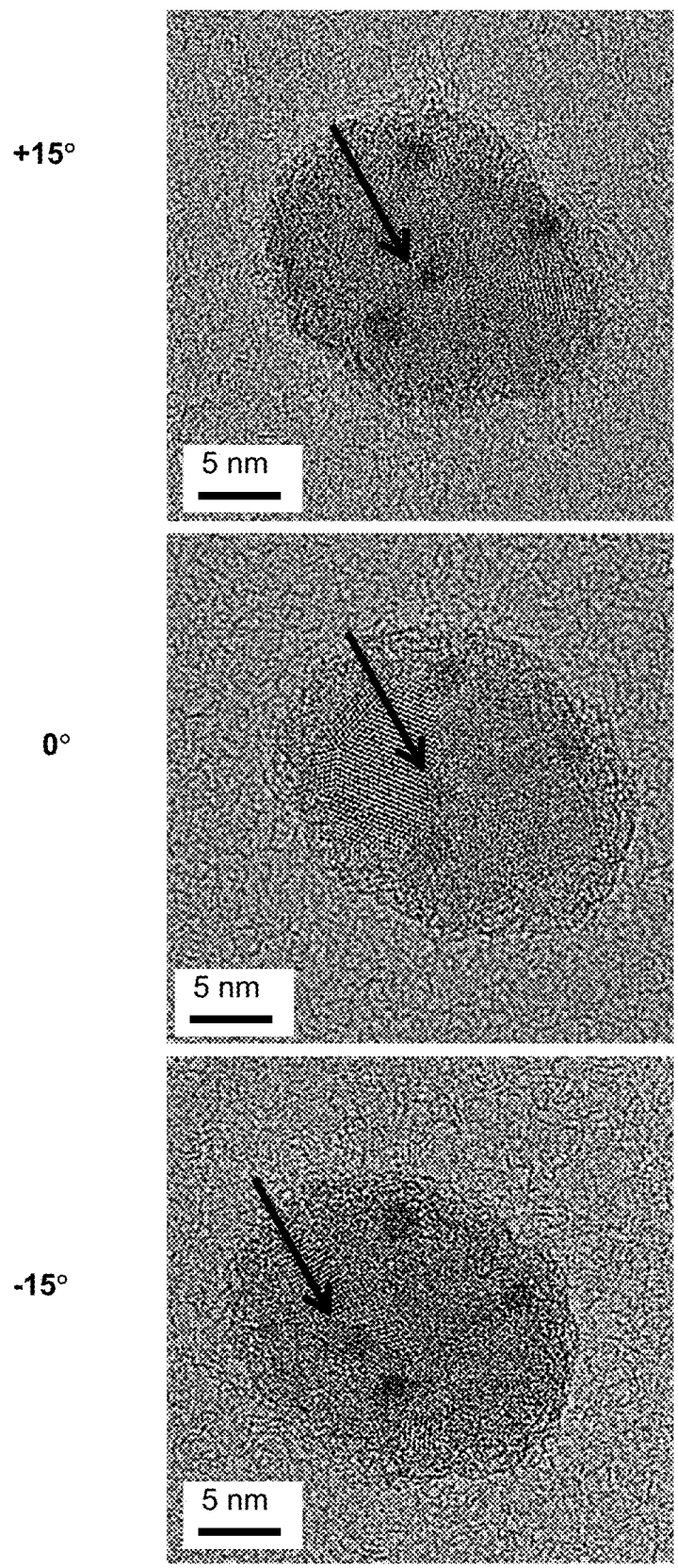
FIG. 7 shows HRTEM images of a single Si-core/Ag-subshell tilted at +15 degrees, 0 degrees, and −15 degrees angles, respectively.

The Si nanograin marked by the arrow shown in FIG. 7 is one such example, being fortuitously positioned with respect to the electron beam such that Si {111} lattice planes can easily be discerned. Multiple twinning is evident, and suggests that it belongs to the decahedral structure. For clarity, the Fourier filtered image formed by selectively masking the nanograin then applying inverse Fourier transform to reduce the noise and enhance the contrast (i.e., FFT pattern) is shown in FIGS. 5 and 6. Most of the Ag nanoclusters on the surface have uniform spherical shape, and exhibit interference patterns which, although non-trivial to quantitatively interpret because of superposition with underlying Si grain lattice(s), provide proof that the Ag nanoclusters are also crystalline.

As mentioned briefly above, a general correlation between the number of crystalline Si grains in the QD core and the number of Ag nanoclusters on the surface was found. This is demonstrated in FIG. 2(C) (two Ag nanocluster and two Si nanograins in the core), FIG. 2(D) (three Ag nanoclusters and three Si nanograins), FIG. 2(E) (six Ag nanoclusters and six Si nanograins), and FIG. 2(F) (eight Ag nanoclusters and nine nanograins), respectively. Therefore, the more Ag nanoclusters, the more Si nanograins.

Figure 3:
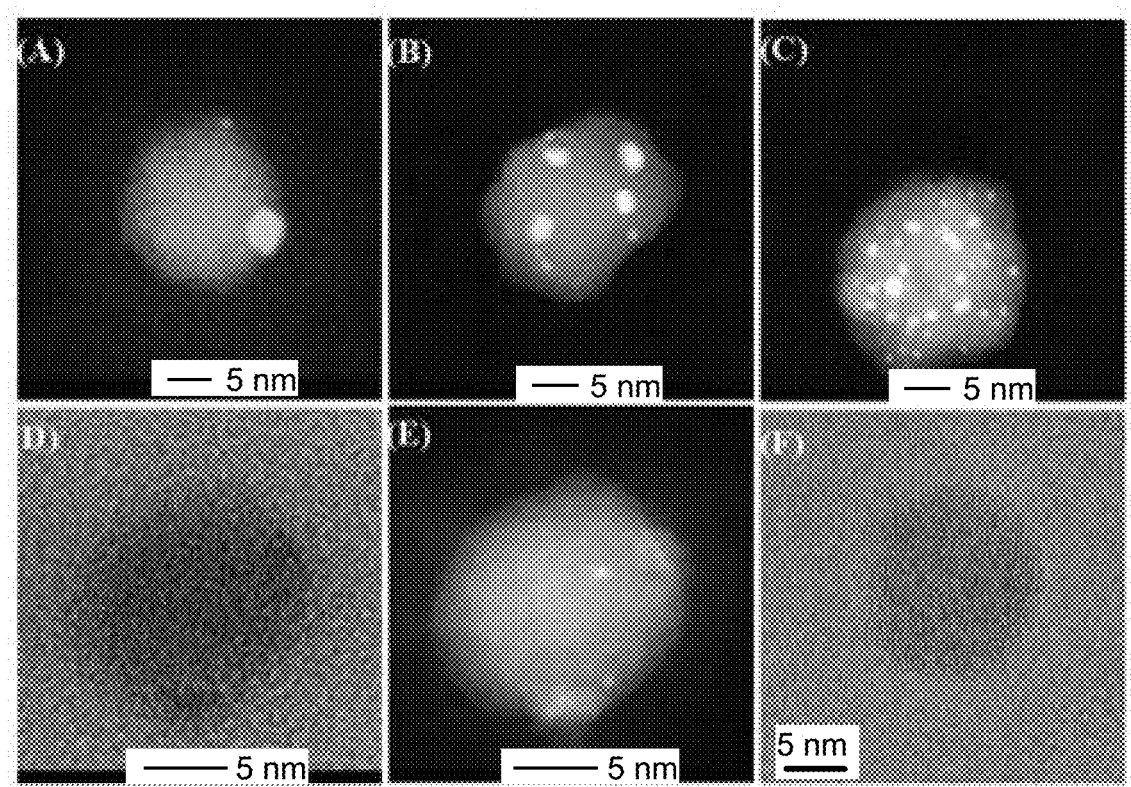
FIG. 3 shows: (A) an HAADF-STEM image of a nanoparticle produced under a DC magnetron power of 60 W for Ag sputtering according to an embodiment of the present invention; (B) an HAADF-STEM image of a nanoparticle produced under a DC magnetron power of 90 W for Ag sputtering according to an embodiment of the present invention; (C) an HAADF-STEM image of a nanoparticle produced under a DC magnetron power of 120 W for Ag sputtering according to an embodiment of the present invention; (D) is a bright-field HRTEM image of a nanoparticle produced under a DC magnetron power of 120 W after plasma cleaning process according to an embodiment of the present invention; (E) an HAADF-STEM image of the nanoparticle produced under a DC magnetron power of 120 W after plasma cleaning process shown in (D); and (F) a bright-field HRTEM image of a "simple" amorphous Si QD (no Ag decoration was applied).

Furthermore, it is possible to control the number of Ag nanoclusters nucleating on the Si core by adjusting the power of the Ag magnetron sputter source 132. FIGS. 3(A) to 3(C) are HAADF-STEM images of nanoparticles produced under different DC magnetron powers. As shown in the figures, a low coverage was achieved by 60 W magnetron power (FIG. 3(A)) and the coverage increased by increasing the power to 90 W (FIG. 3(B)) and 120 W (FIG. 3(C)).

The immiscibility of Si and Ag was briefly mentioned above. The image in FIG. 2A shows segregated Si and Ag regions, with no evidence of intermixing between the low-Z semiconductor and high-Z metal. This observation was further supported by plasma cleaning of the sample to remove the Ag, with the nanocrystalline Si core left intact. Examples after plasma cleaning are shown in the HAADF-STEM micrograph of FIG. 3E and the bright-field HRTEM image of FIG. 3D and in FIG. 9. As shown in these figures, substantially all Ag regions are removed by plasma cleaning. This gives an additional degree of freedom in nanoparticle fabrication; one may retain the hybrid structure if advantageous for a given application, or may selectively remove the catalyst to leave only the core behind.

The present invention provides a novel strategy for deliberately manipulating the nanostructure of freshly-nucleated quantum dots by decoration with suitable catalysts whilst still in transit from the genesis chamber to the deposition substrate. The present invention applies a well-known phenomenon (MIC) in thin film materials science to a previously unreported configuration, facilitating QD nanostructure control and bringing a plethora of potential applications in different fields. This approach, based on a modified magnetron sputter inert gas condensation technique, provides a general route for controlled MIC of semiconductor QDs, and the growth of multicomponent polycrystalline (semiconductor-core)/(metallic-subshell) nanoparticles.

Further Details of Embodiments

More details of the equipment and the evaluations of embodiments of the present invention are described below while some descriptions below overlap the above descriptions.

Deposition Equipment

A UHV deposition system (Mantis Deposition Ltd, UK) was used for the production of the amorphous (a) Si and nanocrystalline Si-core/Ag-subshell quantum dots (QDs). The first chamber of the UHV system is the aggregation chamber 102 where the nanoparticle beam is formed. This chamber contains the magnetron head 104, which is movable via a linear drive 126, and is enclosed in a coolant jacket, constantly flushed with water at 16 Celsius degrees through water provided a connection port for cool water 124. An Ar/He gas mix is introduced at the magnetron head 104 through the aggregation gas feed 128, and is drawn by the strong pressure differential through the aperture 130 at the other end of the chamber 102. The Ar serves as the sputtering gas, whilst the He is introduced as a carrier gas.

Materials (Substrate and Targets)

A 1" silicon magnetron sputtering target (Si n-type, purity >99.999%, resistivity: <0.001 Ohm-m, dimension: 25 mm diameter×0.125" thick) was purchased from Kurt J. Lesker, PA. A custom-shape silver magnetron sputtering target (Ag, purity >99.99%, resistivity ~$2\times10^{-8}$ Ohm-m, dimension: 150 mm length×50.8 mm width×3.0 mm thick) was purchased from K. Tech. Ltd., UK. Undoped Si dice with (100) orientation and 5 mm×5 mm in size for AFM measurements were purchased from mtixtl, USA. Carbon-coated grids (400 mesh) were purchased from Ted Pella Ltd. for TEM/STEM analysis.

Preparation Of Substrates

Prior to deposition, the silicon dice (for AFM images) were ultrasonicated in acetone, 2-propanol and deionized purified water for 5 min, respectively, and subsequently dried in a stream of high purity nitrogen. The Si dice surfaces exhibited typical RMS roughness of 0.17 nm (measured with contact-mode AFM). Samples of Si-core/Ag-subshell quantum dots for TEM/STEM observations were created by direct deposition onto carbon TEM grids in the UHV chamber.

Production of A—Si and Si—Ag Nanoparticles

First, the Si nanoclusters are formed by gas phase condensation from a flux of sputtered Si atoms from a n-type Si target in an inert gas atmosphere (Ar, at a partial pressure of 70 SCCM and He, at a partial pressure of 5 SCCM) mounted inside a water cooled tube known as the aggregation zone of a NanoGen Trio ion cluster source from Mantis Deposition Ltd. as shown in FIG. 1(A). The supersaturated Si vapor 120 is generated by sputtering an n-type Si target in an inert gas atmosphere (Ar, gas flow 70 SCCM and He, at a gas flow of 5 SCCM) as shown in FIG. 1(A). The gas beam enters the pick-up chamber through the aperture and hits the Si ions that are evaporated by the dc magnetron. The Si vapors are picked up by the Ar gas molecules from the incipient beam and are condensed to yield condensed liquid Si nanoparticles 118. The size of the Si QDs is strictly controlled by the partial pressure inside the pick-up zone. The gas beam containing the cold Si clusters enters the second pick-up zone (shell coater chamber 114) through a 5 mm orifice, and the Ag vapors from an Ag target on the linear magnetron sputter source 132 are embedded into the Ar gas (gas flow 10 sccm), either by forming core-shell nanoparticles or, depending on the degree of miscibility, bimetallic nanoparticles. The sample holder, where the TEM grids and substrate 110 for depositing the nanocrystalline Si-core/Ag-subshell QDs are held, was mounted in front of the nanoparticle beam through a fast entry load lock. The pressure in the pick up zone in the aggregation chamber 102 was about $3.0 \times 10_{-1}$ mbar, and in the substrate deposition chamber, the base pressure was typically $7.0 \times 10^{-8}$ mbar, rising to $1.1 \times 10^{-3}$ mbar with the introduction of Ar/He during the sputtering process.

The growth of the nanocrystalline Si-core/Ag-subshell QDs is strongly dependent on three parameters: the power applied to the magnetron, the flow rate and pressure of the aggregation gas; and the length of the aggregation zone. In this invention, these parameters were adjusted appropriately. The aggregation zone length was set to maximum (95 mm) by moving the magnetron head backward to the fully-retracted position. In some embodiments, the nanocrystalline Si-core/Ag-subshell QDs are produced using 90 W DC power magnetron for Si target (core) and 60 W to 120W for Ag target (core-shell-coater). The deposition time was 40 minute and substrate holder rotation was 2 rpm.

Evaluations

Atomic Force Microscopy (AFM) was used for morphological characterization of the nanoparticles. A loadlock mechanism allowed sample transfer from the deposition UHV system, to the inert gas glovebox containing the AFM (Multimode 8, Bruker, CA), thereby avoiding atmospheric exposure. A controlled $N_2$ environment inside the glovebox ensured <=0.1 ppm oxygen and moisture levels, while allowing scanning of the samples using different AFM modes. The AFM scanner was set on an active vibration isolation table in order to minimize the noise level and guarantee the highest resolution performance. The AFM scans were performed in tapping mode using commercial silicon-nitride triangular cantilever (spring constant of 0.35 N/m, resonant frequency 65 kHz) based tips with a typical radius less than 10 nm. The height distribution curves and root-mean-square (rms) roughness values were calculated from AFM images using the Scanning Probe Image Processor (SPIP) software (Image Metrology, Horsholm, DK).

High resolution bright field (BF) and high-angle annular dark field (HAADF) imaging were carried out using an FEI Titan 300 kV TEM/STEM, equipped with a probe corrector for aberration-corrected STEM imaging. In TEM mode, the spherical and chromatic aberrations were 1.2 mm and 1.6 mm, respectively. Point resolution was 0.20 nm, at Scherzer defocus conditions of −50 nm to +60 nm. In STEM mode, the spherical aberration was in the range 0-5 micrometers, with chromatic aberration of 1.8-2.0 mm. Optimum STEM-HAADF resolution was approximately 0.1 nm.

As described above, some samples were plasma cleaned while mounted in the TEM holder, allowing TEM imaging of the same samples before and after the plasma cleaning. Plasma cleaning of the nanocrystalline Si-core/Ag-subshell QDs was performed using commercially available plasma cleaner (E.A. Fischione, Model 1020), using a gas mixture of Ar and $O_2$, in the ratio 3:1, with a 13.56 MHz oscillating field system, and expected ion energies less than 12 eV.

Figure 4:
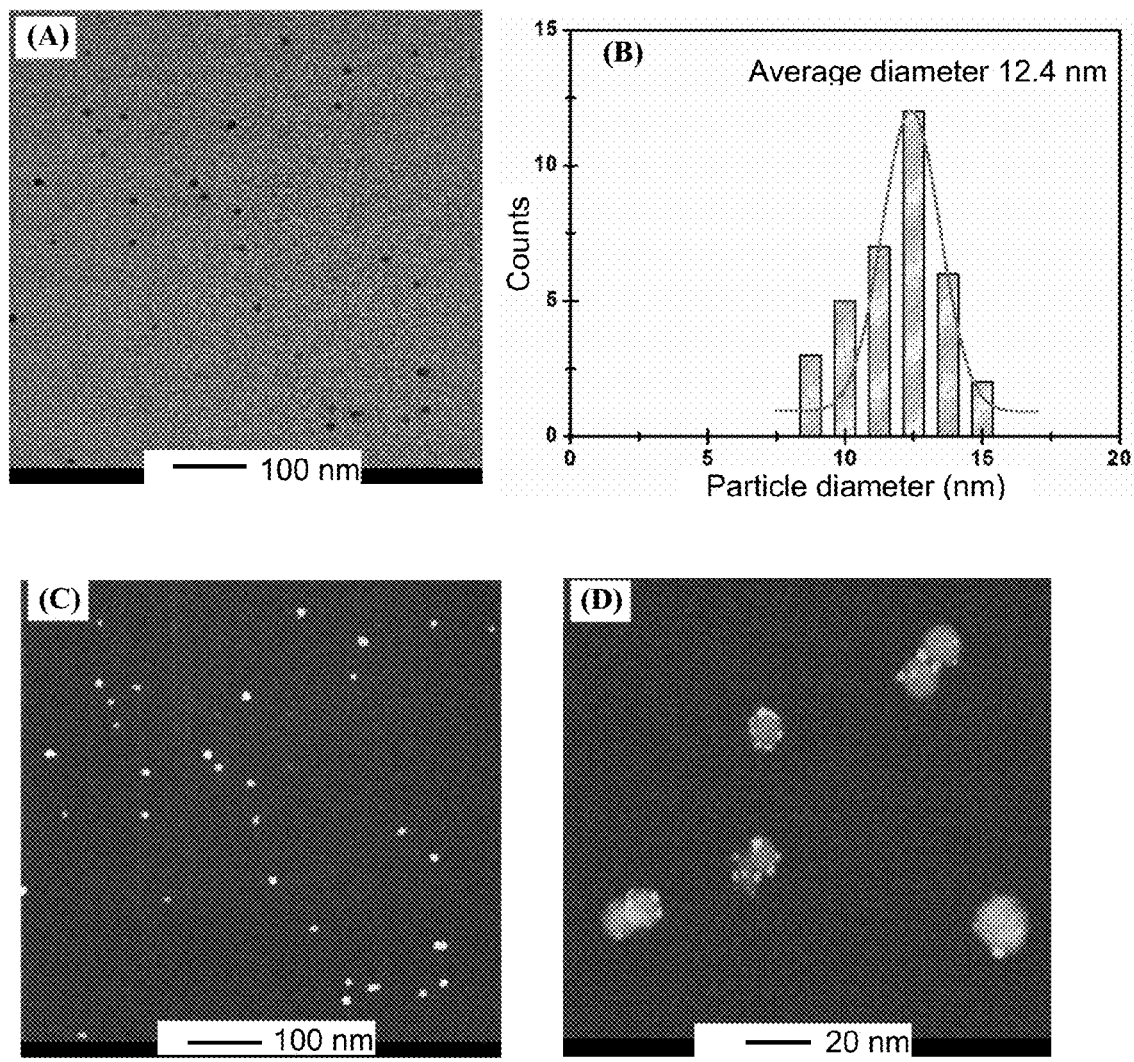
FIG. 4 shows; (A) an overview bright field TEM image of nanoparticles according to an embodiment of the present invention; (B) a histogram showing diameter distribution of the embodiment shown in (A); (C) an overview HAADF-STEM image of the nanoparticles shown in (A); and (D) annother overview HAADF-STEM image of the nanoparticles shown in (A).

FIG. 4(A) is an overview bright field TEM image of nanoparticles according to an embodiment of the present invention. FIG. 4(B) is a histogram showing diameter distribution of the embodiment shown in FIG. 4(A). FIG. 4(C) is an overview HAADF-STEM image of the nanoparticles shown in FIG. 4(A). FIG. 4(D) is another overview HAADF-STEM image of the nanoparticles shown in FIG. 4(A) with a greater magnification. As shown in the figures, in this embodiment, the average diameter was found to be 12.4 nm.

FIG. 5 is an HAADF-STEM image of a Si-core/Ag-subshell quantum dot according to an embodiment of the present invention together with a FFT pattern. The FFT pattern shows that the region is polycrystalline STEM scanning artifacts, owing to mechanical instability of the microscope, are also evident.

FIG. 6 is an HAADF-STEM image of selected Ag nanoclusters on a Si-core/Ag-subshell nanopartcile according to an embodiment of the present invention together with the corresponding FFT patterns for the indicated regions. The FFT patterns indicate that these regions are crystalline.

FIG. 7 shows HRTEM images of a single Si-core/Ag-subshell nanoparticle according to an embodiment of the present invention tilted at +15 degrees, 0 degrees, and −15 degrees angles, respectively. These figures further confirm that the structures of the Si-core/Ag-subshell nanoparticle as described above.

FIG. 8(A) shows a FFT pattern from the HR TEM images of amorphous Silicon nanoparticle. FIG. 8(B) shows a FFT pattern from the HR TEM images of crystalline Silicon nanoparticle. As compared with the FFT patterns shown above, it is evident that the nanoparticles of the present invention have crystalline Si grains.

FIG. 9 shows additional images of Si-core/Ag-subshell QDs (quantum dots) after plasma cleaning process according to an embodiment of the present invention; (A) are (C) are bright-field images and (B) and (D) are HAADF-STEM images, respectively. As described above, the images show that plasma cleaning is effective for removing Ag from the Si-core.

Figure 10:
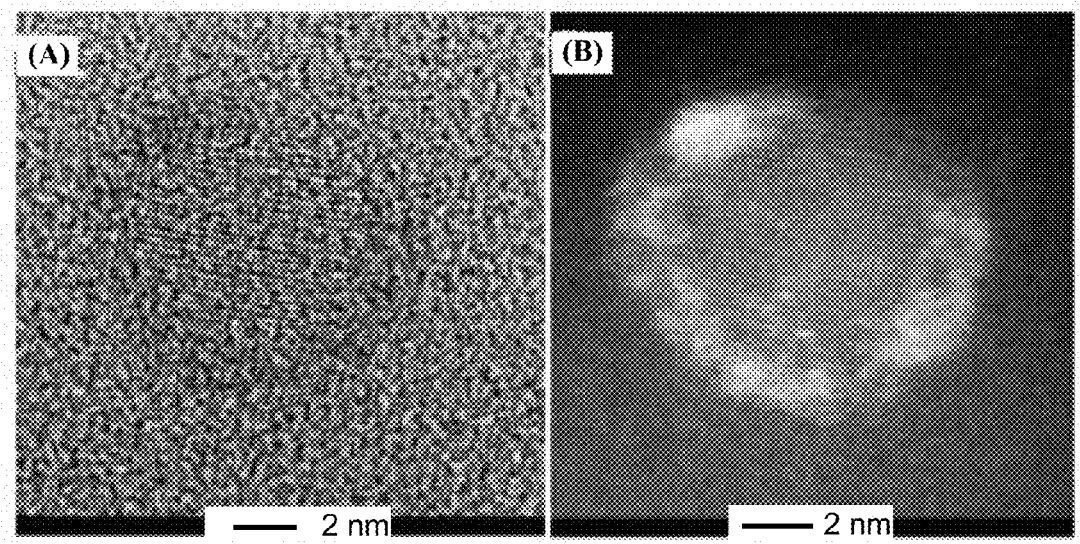
FIG. 10 shows TEM images of a crystalline Si QDs covered by Ag sub shell according to an embodiment of the present invention; (A) is a bright field image and (B) is an HAADF-STEM image.

FIG. 10 shows TEM images of a crystalline Si QDs covered by Ag sub shell according to an embodiment of the present invention; (A) is a bright field image and (B) is an HAADF-STEM image. These images also confirm the characteristics of the nanoscale crystallized Si particle covered by Ag sub shell, as described above.

Modeling

Figure 11:
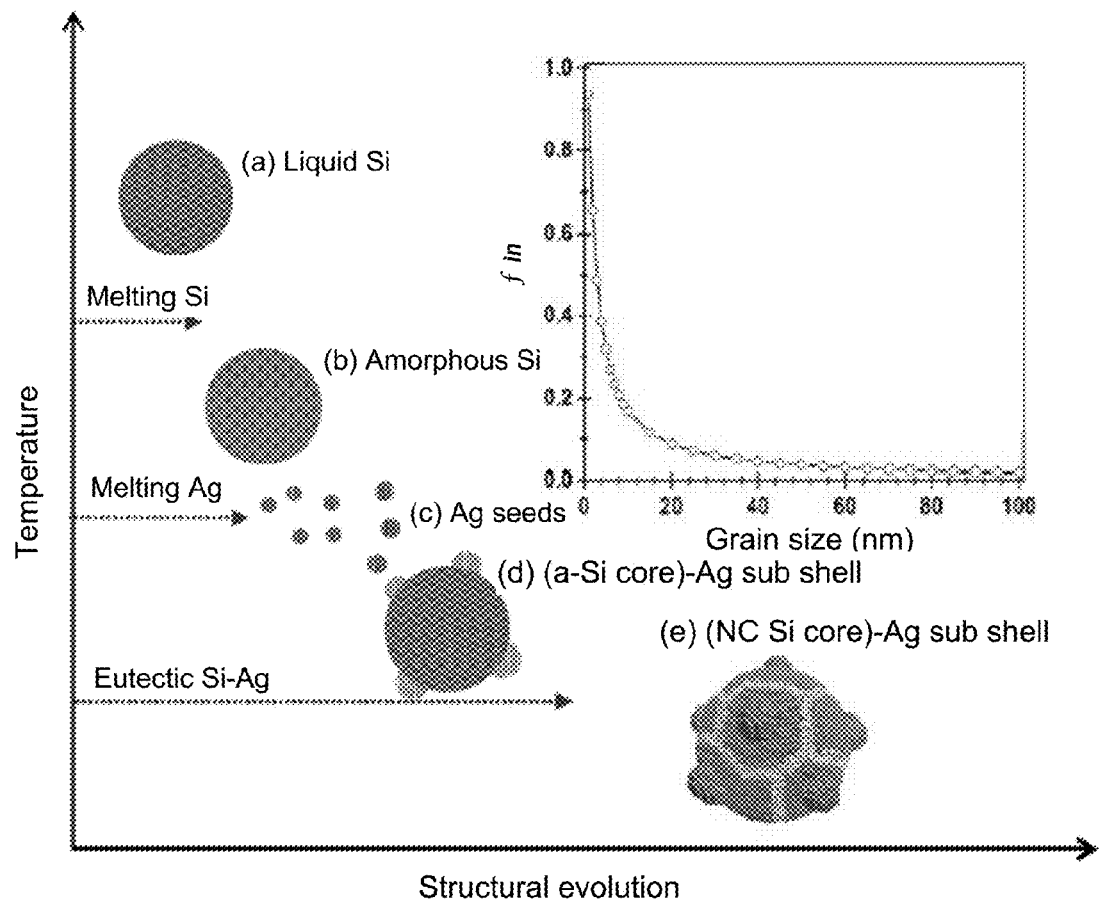
FIG. 11 is a schematic illustration of the growth process of the nanocrystalline Si core-Ag subshell QDs. The inset shows the volume fraction of the intergrain region as a function of the grain size assuming a grain boundary thickness of 0.6 nm.

FIG. 11 is a schematic illustration of the growth process of the nanocrystalline Si core-Ag subshell QDs. The inset shows the volume fraction of the intergrain region as a function of the grain size assuming a grain boundary thickness of 0.6 nm. FIG. 11 shows a phenomenological model for the evolution of nanocrystalline Si core-Ag subshell nanoparticles from amorphous Si QDs. Initially, the evaporated Si atoms nucleate into droplets, still in a liquid state above the melting temperature of Si. These particles develop a solid amorphous structure upon cooling through the melting temperature.

Meanwhile, Ag atoms are released from the surface of the Ag sputtering target, and begin to interact with the amorphous Si clusters. Small Ag nanoclusters nucleate on the surface of the Si, as evidenced by MD simulations. Given the eutectic nature of this material set, a liquidus conjunction with Ag leads to recombine the reacting with amorphous Si surfaces and forming an amorphous-Si and Ag-subshell structure. Upon cooling below the eutectic temperature, the Ag clusters segregate at the surface, and both materials adopt a crystalline structure. Here, the Ag seeds play the central role in increasing the crystallinity of the amorphous Si.

Due to the small dimensions of the nanophase particles described in this invention, the volume of atoms in the disordered grain boundaries represents an atypically large fraction of the entire nanoparticle volume. Assuming a regular tetracaidecahedral grain shape model corresponding to the decahedral structure of the Si grains, with a smaller axis "d" referring to as the grain size, and a shell of thickness "s" as the grain boundary part, the volume fraction of the inter-grain regions is given by:

Math 1

$$f_{in} = 1 - ((d-s)/s)^3 \quad \text{(Eq. 1)}$$

Here, the subscripts in refers to the intergrain. The inset in FIG. 11 shows the volume fraction of the inter-grain regions as a function of grain size, calculated using Eq. 1. According to this model with a grain size of the order of the average diameter of our nanoparticles, the volume fraction of the intergrain region is 27%, while at d=6 nm, about a half of the average diameter of the nanoparticle. The volume fraction increases to 60% for d=2.4 nm; the volume fraction of the intergrain region is about 50% of the volume of the particle. So, in comparison to conventional coarse-grained poly-crystalline materials with the same composition and grain size above 50 nm, nanoparticles of the present invention will have improved physical properties like increased thermal expansion, specific heat and strength, and reduced density.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

REFERENCE SIGNS LIST

- 100 Deposition System
- 102 Aggregation Chamber
- 104 Magnetron Head (DC Magnetron)
- 106 Sputtering Target Material
- 108 Sample Deposition Chamber
- 110 Substrate
- 112 Aggregation Zone (Nanoparticles Beam Source)
- 114 Shell Coater Chamber
- 116 Silver Vapor
- 118 Condensed Liquid Si NanoParticles
- 120 Super-saturated Si Vapor
- 122 Connection Ports for Water and Gas
- 124 Connection Port for Cool Water
- 126 Linear Drive to Move DC Magnetron
- 128 Aggregation Gas Feed
- 130 Aperture
- 132 Linear Magnetron Sputter Source (Silver)

The invention claimed is:

1. A method of forming crystallized semiconductor particles, comprising:
    forming amorphous semiconductor particles in a vacuumed aggregation chamber;
    transporting the amorphous semiconductor particles formed in the vacuumed aggregation chamber to a vacuumed deposition chamber within which a substrate is held; and
    applying a vapor of a metal catalyst to the amorphous semiconductor particles while still in transit to the substrate in the vacuumed deposition chamber to induce crystallization of at least portion of the amorphous semiconductor particles via the metal catalyst in the transit, thereby depositing the crystallized semiconductor particles with the metal catalyst attached thereto onto the substrate.

2. The method according to claim 1, wherein the amorphous semiconductor particles are amorphous silicon particles having a dimension less than 50nanometers.

3. The method according to claim 1, wherein the metal catalyst is silver (Ag).

4. The method according to claim 1, further comprising performing plasma cleaning on the crystallized semiconductor particles to remove the metal catalyst.

5. The method according to claim 1, wherein the step of applying a vapor of a metal catalyst to the amorphous semiconductor particles includes generating the vapor of the metal catalyst by linear magnetron sputtering.

6. The method according to claim 5, wherein the step of generating the vapor of the metal catalyst includes adjusting a power of the linear magnetron sputtering such that a desired number of dots made of the metal catalyst is formed on the semiconductor particles on average.

7. The method according to claim 1, wherein the step of applying a vapor of a metal catalyst to the amorphous semiconductor particles includes forming dots made of the metal catalyst on the amorphous semiconductor particles such that the number of dots on respective semiconductor particles corresponds to the number of crystalline grains in respective resulting poly-crystallized semi-conductor particles.

8. The method according to claim 1, wherein in the step of applying a vapor of a metal catalyst to the amorphous semiconductor particles, the amorphous semiconductor particles are poly-crystallized, thereby depositing poly-crystallized semiconductor particles on the substrate.

9. A nanoscale poly-crystallized semiconductor particle, comprising a metal-induced poly-crystallized semiconductor particle having a dimension less than 50 nanometers; and
    dots made of metal catalyst of any one of silver (Ag), aluminum (Al), gold (Au), nickel (Ni), palladium (Pd) and copper (Cu),
    wherein the metal-induced poly-crystallized semiconductor particle is a silicon particle that is poly-crystallized by the metal catalyst.

10. The nanoscale poly-crystallized semiconductor particle according to claim 9, wherein the metal-induced poly-crystallized semiconductor particle is a silicon particle that is poly-crystallized by silver (Ag).

11. The nanoscale poly-crystallized semiconductor particle according to claim 10, wherein the dots are made of silver on the semiconductor particle.

* * * * *